(12) United States Patent
Fan et al.

(10) Patent No.: US 7,763,913 B2
(45) Date of Patent: Jul. 27, 2010

(54) IMAGING METHOD, APPARATUS, AND SYSTEM PROVIDING IMPROVED IMAGER QUANTUM EFFICIENCY

(75) Inventors: Xiaofeng Fan, Boise, ID (US); Frederick Brady, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 121 days.

(21) Appl. No.: 11/636,974

(22) Filed: Dec. 12, 2006

(65) Prior Publication Data
US 2008/0135896 A1 Jun. 12, 2008

(51) Int. Cl.
*H01L 27/146* (2006.01)

(52) U.S. Cl. .............................. 257/233; 257/E27.133; 438/59

(58) Field of Classification Search ................. 257/233, 257/292
See application file for complete search history.

(56) References Cited

U.S. PATENT DOCUMENTS

| | | | |
|---|---|---|---|
| 3,971,065 A | 7/1976 | Bayer | |
| 5,122,850 A | 6/1992 | Burkey | |
| 5,939,742 A | 8/1999 | Yiannoulos | |
| 5,942,775 A | 8/1999 | Yiannoulos | |
| 6,140,630 A | 10/2000 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,783,900 B2 | 11/2003 | Venkataraman | |
| 6,885,047 B2 * | 4/2005 | Shinohara et al. | 257/292 |
| 7,110,028 B1 | 9/2006 | Merrill | |
| 7,132,724 B1 * | 11/2006 | Merrill | 257/440 |
| 7,317,218 B2 * | 1/2008 | Tanaka et al. | 257/292 |
| 7,498,650 B2 * | 3/2009 | Lauxtermann | 257/460 |
| 7,531,859 B2 * | 5/2009 | Tanaka | 257/292 |
| 2003/0169360 A1 | 9/2003 | Rhodes | |
| 2004/0222449 A1 | 11/2004 | Koyama | |
| 2005/0040446 A1 * | 2/2005 | Shinohara | 257/292 |
| 2005/0116250 A1 * | 6/2005 | Mizuguchi | 257/140 |
| 2006/0267053 A1 * | 11/2006 | Yang et al. | 257/291 |
| 2007/0075338 A1 | 4/2007 | Park et al. | |
| 2007/0114583 A1 * | 5/2007 | Lee | 257/292 |

FOREIGN PATENT DOCUMENTS

EP 1 617 479 A2 1/2006

OTHER PUBLICATIONS

International Search Report dated Sep. 30, 2008.

* cited by examiner

*Primary Examiner*—Sue Purvis
*Assistant Examiner*—Benjamin P Sandvik
(74) *Attorney, Agent, or Firm*—Dickstein Shapiro LLP

(57) ABSTRACT

A method, apparatus, and system that provides one or more charge collecting protection regions in a pixel array, each formed below a storage region of a pixel cell, but not below at least one photosensor of one pixel of the array. The storage region includes a floating diffusion region and/or a storage gate in the pixel cell of the imaging device. The protection regions can keep stray charges from reaching the storage regions.

43 Claims, 9 Drawing Sheets

IMAGING METHOD, APPARATUS, AND SYSTEM PROVIDING IMPROVED IMAGER QUANTUM EFFICIENCY

FIELD OF THE INVENTION

The invention relates to imaging devices and systems having improved quantum efficiency and methods of fabrication.

BACKGROUND OF THE INVENTION

Solid state image sensors, also known as imaging devices, have commonly been used in various photo-imaging applications. Current applications of imaging devices include cameras, mobile telephones, scanners, machine vision systems, vehicle navigation systems, video telephones, computer input devices, surveillance systems, auto focus systems, star trackers, motion detector systems, and image stabilization systems among other uses.

Imaging devices, when used with appropriate imaging circuits, capture, process, store, and display images for various purposes. For example, imaging devices are typically formed with an array of pixels containing photosensors, such as photogates, phototransistors, photoconductors, or photodiodes. The photosensors each absorb incident radiation of a particular wavelength (e.g., optical photons or x-rays) and produce a signal corresponding to the intensity of light impinging on that element when an image is focused on the pixel array. The signal is then processed and used for storage, printing, display, or other purposes.

There are a number of different types of semiconductor-based imaging devices, including charge coupled devices (CCDs), photodiode arrays, charge injection devices (CIDs), hybrid focal plane arrays, and complementary metal oxide semiconductor (CMOS) imaging devices. Examples of CMOS imaging devices, processing steps thereof, and detailed descriptions of the functions of various CMOS elements of a CMOS imaging device are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, each of which is assigned to Micron Technology, Inc. The disclosures of each of the forgoing patents are hereby incorporated by reference in their entirety.

During operation of imaging devices, photons of incident radiation impinging on the imaging devices may not all reach the photosensors to be converted into electrons. Also, the converted electrons may be lost in the various layers of the device or in adjacent pixel cells, or be mixed with dark current electrons in the various layers. It is thus desirable to provide an imaging device and/or system that mitigates the effects of the above discussed deficiencies.

DETAILED DESCRIPTION OF THE INVENTION

Figure 1:
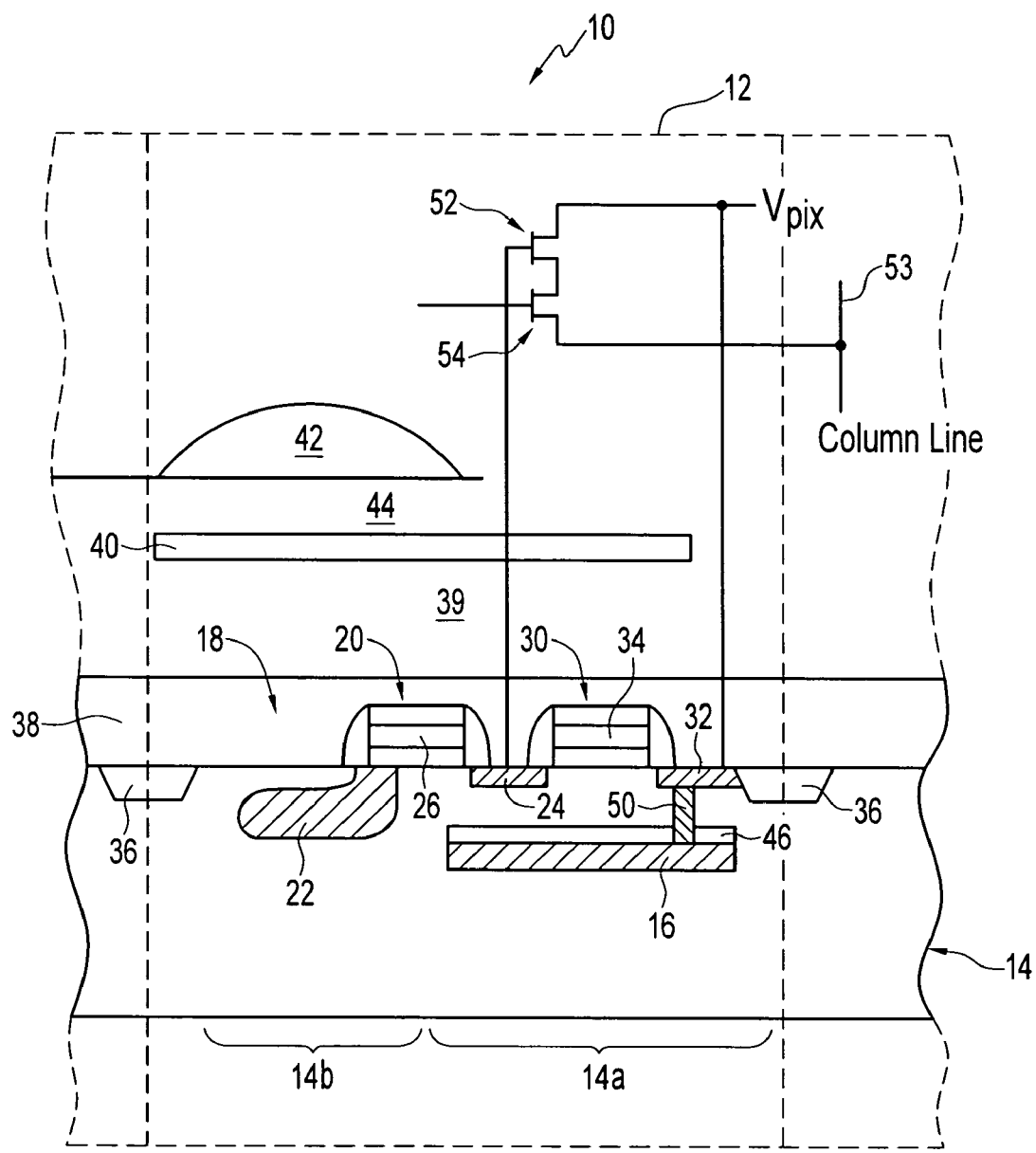
FIG. 1 is a representative diagram of a portion of an imaging device including an imager pixel cell constructed in accordance with a first embodiment.

In the following detailed description, reference is made to the accompanying drawings, which form a part hereof and show by way of illustration specific embodiments and examples in which the invention may be practiced. These embodiments and examples are described in sufficient detail to enable one skilled in the art to practice them. It is to be understood that other embodiments and examples may be utilized, and that structural, logical, and electrical changes and variations may be made. Moreover, the progression of processing steps is described as an example; the sequence of steps is not limited to that set forth herein and may be changed, with the exception of steps necessarily occurring in a certain order.

The term "substrate" used herein may be any supporting structure including, but not limited to, a semiconductor substrate having a surface on which devices can be fabricated. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate in the following description, previous process steps may have been utilized to form regions or junctions in or over the base semiconductor or foundation.

The term "pixel" or "pixel cell" as used herein, refers to a photo-element unit cell containing a photosensor for converting photons to an electrical signal as may be employed by an imaging device. Although the pixel cells are illustrated herein in the exemplary embodiments as CMOS four-transistor (or 4-T) pixel cells, this is not intended to be limiting in any way. For example, the pixel cells could have more or less than four transistors and the embodiments disclosed herein may be employed in other solid state imagers other than CMOS imagers where a different pixel architecture may be used.

The following embodiments provide an imaging device and/or system having an array of pixel cells. Each pixel cell has a photosensor and a storage region formed of a first conductivity type in association with a substrate. A charge collecting protection region of the first conductivity type is provided in at least some pixel cells below the storage region but not below the photosensor. For example, in a p-type substrate imaging device, the charge collecting protection region is formed as an n-well or "tub" located below at least the floating diffusion region, but not below the photosensor in the same pixel cell. The charge collecting protection region is capable of collecting excess electrons present in the imaging device substrate and preventing such electrons from reaching the storage regions, thereby mitigating the effects of crosstalk, blooming or saturation, and/or dark current.

For example, the charge collecting protection region can be provided under the floating diffusion regions in an imaging device to prevent dark current electrons from reaching such floating diffusion regions. Additionally or alternatively, the charge collecting protection region can be provided under the storage gates in an imaging device employing a global shutter, to prevent dark current electrons from reaching the storage gates and/or the floating diffusion regions. In a global shutter application, charges representing an entire frame of a captured image are transferred to the storage gates in the pixel array all at once and then read out from the storage gates to the floating diffusion regions through respective transfer transistors row by row. In such a case, the protection region can prevent dark current electrons from mixing with the charges in the storage gates and/or the floating diffusion regions that are accessed later during the read-out operation, thereby mitigating against an uneven brightness imposed on the reconstructed image output from the imaging device.

In addition, since the protection region is not provided below at least selected photosensors in an imaging device, photons reaching deeper in the substrate can still be captured by such selected photosensors and converted into electrons, and can be effectively retained in the photosensors. Accordingly, the imaging device can also have an improved quantum efficiency.

Various embodiments will now be described with reference to the drawings, in which similar components and elements are designated with same reference numerals and redundant description is omitted. Although the embodiments are described in relation to use with a CMOS imaging device employing a pinned photodiode as a photosensor, as noted, the embodiments are not so limited and have applicability to other solid state imaging devices.

FIG. 1 shows a representative diagram of a portion of a solid-state imaging device pixel array 10, which includes a plurality of pixel cells 12 constructed substantially similarly and arranged in rows and columns. The pixel array 10 is formed in association with a substrate 14 of any known semiconductor supporting structure, such as one of those discussed hereinabove. For example, the substrate 14 can be a p$^+$ substrate, in which case one or more optional p$^-$ epitaxial layers (not shown) can be formed over the p$^+$ substrate 14. It should be noted that the substrate 14 may also be a p$^-$ substrate, in which case there is no need for a p$^-$ epitaxial layer. Also, the following description is made in connection with a semiconductor device in which the substrate 14 is formed as a p-type substrate. Nevertheless, one skilled in the art would appreciate that the various embodiments described can be modified and applied to a semiconductor device formed using an n-type substrate.

A charge collecting protection region 16 is provided and formed in the pixel cell 12 in association with the substrate 14. The charge collecting protection region 16 has a conductivity type different from that of the substrate 14. For example, the charge collecting protection region 16 can be formed as an n-type well or "tub" when the underlying substrate 14 has a p-type conductivity. As is shown in FIG. 1, the charge collecting protection region 16 is formed in a selected area 14a of the substrate 14, but not in a predetermined area 14b of the substrate 14 corresponding to the location of a photosensor 18 of the pixel cell 12. The charge collecting protection region 16 will be described in greater detail below.

A photosensor 18 is provided in each pixel cell 12 for generating charge in response to the incident light impinging on the pixel array 10. In particular, each photosensor 18 of a pixel cell 12 is formed within the predetermined area 14b of the substrate 14. The photosensors 18 of the pixel array 10 can be formed and patterned in any of various ways to detect various components (e.g., "color") of the incident light. In one example, red, green, and blue photosensors 18 are provided and arranged in a predetermined pattern, such as the Bayer pattern, for absorbing specific colors of visible light. The "color" of a photosensor 18 is determined by the color filter type provided above such photosensor 18 in a color filter layer 40. For example, a blue photosensor 18B (FIG. 2B) is covered by a color filter element that passes only blue light. In another example, the photosensors 18 can be formed to absorb infrared light. Hereinafter, the term "photosensor 18" will be used to refer to a photosensor generally and without reference to any particular color.

In each pixel cell 12, a transfer transistor 20 is provided and located next to a photosensor 18. The transfer transistor 20 comprises source and drain regions 22 and 24, the latter of which is also a floating diffusion region for storing charge transferred from a corresponding photosensor 18, and a gate stack 26 controlled by a transfer control signal TX. The transfer transistor 20 is optional, and if omitted the source and drain regions 22 and 24 are joined together (not shown). The drain region 24 receives charges from an associated photosensor 18, such as upon the operation of the transfer gate 26. The charges stored in the floating diffusion region 24 can be used to produce a pixel image signal $V_{Photo}$ (see FIG. 5).

Additionally, a reset transistor 30 is provided, which includes regions 24 and 32 and a gate stack 34 controlled by a reset control signal RST. One or more pixel isolation regions 36 can be provided to surround at least a portion of the pixel cell 12 to isolate the same from an adjacent pixel cell 12. As shown schematically, the pixel cell 12 also includes a source follower transistor 52 having a gate connected to the floating diffusion region 24 for receiving and amplifying the charge signal, and a row select transistor 54 for selectively coupling the output of the source follower transistor 52 to a pixel array column line 53. The operation of the photosensor 18, the transfer transistor 20, the reset transistor 30, the source follower transistor 52, and the row select transistor 54 are known to those skilled in art and are described in great detail in the above mentioned U.S. patents assigned to Micron Technology, Inc.

A protective layer 38 is provided and formed over the photosensors 18, the transfer transistors 20, the reset transistor 30, the source follower transistor 52, and the row select transistor 54 to act as a passivation and planarization layer for the array 10. The protective layer 38 may be a layer of BPSG, PSG, BSG, silicon dioxide, silicon nitride, polyimide, or other well-known light transmissive insulator. In addition, a plurality of conventional layers 39, such as interlayer dielectric layers, with associated metallization patterns can be formed over the protective layer 38 by any of various methods, which are known in the art.

The color filter layer 40 can be provided over the protective layer 38 and above the conventional layers 39 and comprise an array of light selective elements to allow selected light components, such as red, green, and blue light or infrared light to pass therethrough. The light selective elements in the color filter layer 40 are arranged in a similar pattern to that of the photosensors 18 described above. Details for the arrangement and pattern of the light selective elements can be understood by the person having ordinary skill in the art as exemplified by U.S. Pat. Nos. 6,783,900 and 3,971,065, which are herein incorporated by reference.

An array of micro-lenses 42 is formed above the color filter layer 40, so that each micro-lens 42 has its focal point centered over the corresponding photosensitive element (i.e., photosensor 18) in the same pixel cell 12. A spacer layer 44 can be provided and formed under the micro-lenses 42 and over the color filter layer 40. The thickness of the spacer layer 44 and size and configuration of the micro-lenses 42 can be adjusted so that each photosensor 18 is at a focal point for the light traveling through the corresponding micro-lens 42.

As is shown in the various drawing figures, the charge collecting protection region 16 is positioned below the floating diffusion region 24. For example, the protection region 16 is formed below a portion or the entirety of the floating diffusion region 24. The protection region 16 can also extend laterally and below at least a portion of the transfer gate 26. Additionally, the charge collecting protection region 16 is spaced from the floating diffusion region 24, such as by a region of a different conductivity type. For example, the protection region 16 is positioned about 1 µm to about 4 µm, or about 2 µm to about 2.5 µm, under the upper surface of the substrate 14, so that a portion of the substrate 14 is located between the floating diffusion region 24 and the protection region 16. The protection region 16 so provided is capable of attracting excess electrons present in the substrate 14 below the protection region 16 to catch substrate electrons and prevent such electrons from reaching the floating diffusion region 24 and/or traveling to adjacent pixel cells 12.

In addition, the protection region 16 can extend laterally within each pixel cell 12 and below one or more of the reset gate 34, a doped region 32 which is part of the reset transistor 30, and the pixel isolation regions 36. For example, FIG. 1 shows a protection region 16 extending continuously and below the entire reset transistor 30 and floating diffusion region 24. Protection region may also extend below the source follower transistor 52 and the row select transistor 54, which, as noted, are shown schematically in FIG. 1. Thus, the selected region 14a may extend under all pixel cell 12 structures except for the photosensor 18.

The protection region 16 and the floating diffusion region 24 are formed to have the same conductivity type, such as an n-type conductivity. For example, the protection region 16 can be in the form of an n-type well or tub and have a thickness about 0.05 µm to about 4 µm, or more preferably from about 0.5 µm to about 2.5 µm. Various known implant methods can be employed to form the protection region 16. For example, the protection region 16 can be formed by a doping process, which will be described in greater detail below.

Optionally, an isolation region 46 can be provided and formed over or on the protection region 16 to assist in isolating the protection region 16 from the various surface charges in regions, such as the floating diffusion region 24, and/or the source/drain regions of transistors 20, 30, 52, and 54. In one embodiment, the isolation region 46 can be of a p-type conductivity for an n-type protection region 16. The isolation region 46 so formed can prevent the protection region 16 from attracting charges from the floating diffusion region 24 and the source/drain regions of overlying transistors of the pixel cell 12.

When being formed to have an n-type conductivity in a p-type substrate 14, the protection region 16 can be biased positive in operation, for electron collection within the protection region 16. The biasing operation can be accomplished by any of known techniques. For example, the protection region 16 can be connected to a voltage source through an n-type implant 50. The voltage source can be in the range of about 0.5V and about 4.0V or in the range of about 2.5V to about 3.3V. In one embodiment, the implant 50 can connect the protection region to the doped region 32 of the reset transistor 30 where voltage $V_{pix}$ is supplied. In such a case, the voltage source for biasing the protection region 16 can be the same source outputting a positive voltage $V_{pix}$. No additional voltage source will be needed.

During operation, electrons, e.g., dark current electrons, cross-talk electrons, etc., present in the substrate 14 below the protection regions 16 are collected in the protection regions 16 and swept away prior to reaching the floating diffusion region 24, and/or other n-type diffusion areas within the selected area 14a. Electrons generated from pixel blooming can also be collected in the protection regions 16 as well.

Also as is shown in FIG. 1, the protection region 16 discontinues in the predetermined area 14b of the substrate 14 and thus is not present below the photosensor 18, which is formed within the predetermined area 14b in the substrate 14. As previously discussed, the predetermined area 14b maintains the conductivity type of the substrate 14 and does not contain a region of a different conductivity type. When incident light passes through the micro-lens 42 and reaches the substrate 14, the area 14b allows photons arriving at various depth in the predetermined area 14b to be converted to electrons by the photosensor 18. Without the presence of an n-type well or tub 16 in the predetermined area 14b, the converted electrons can be effectively captured within source region 22 by the photosensor 18 and retained for image processing. The resulting pixel array 10 thus has an improved quantum efficiency as loose electrons present in the substrate 14 will not interfere with electrons present in structures protected by an underlying protection region 16.

The operation of the pixel array 10 will next be described. When incident radiation in the form of photons passes the color filter layer 40 and strikes the photosensors 18, the photo-generated electrons accumulate in the source region 22. The transfer control signal TX operates to transfer the accumulated charges from the source region 22 to the floating diffusion region 24, where the charges are stored temporarily. The charges in the floating diffusion region 24 are applied to the gate of a source follower transistor 52, converted to an image output signal output to a row select transistor 54, and then output to readout circuitry connected to an array column line. The reset control signal RST operates to reset the floating diffusion region 24 to a predetermined initial voltage just prior to signal readout. Both a read signal $V_{RST}$ and an image output signal $V_{photo}$ produced by the source follower transistor 52 are sampled and held as described in greater detail below.

It should be noted that the details given in the preceding examples are not limiting. One skilled in the art will appreciate that the pixel array 10 and its various components can be formed and operate in various other manners and that the pixel cell 12 is not limited to the four transistor architecture illustrated in FIG. 1.

Figure 2A:
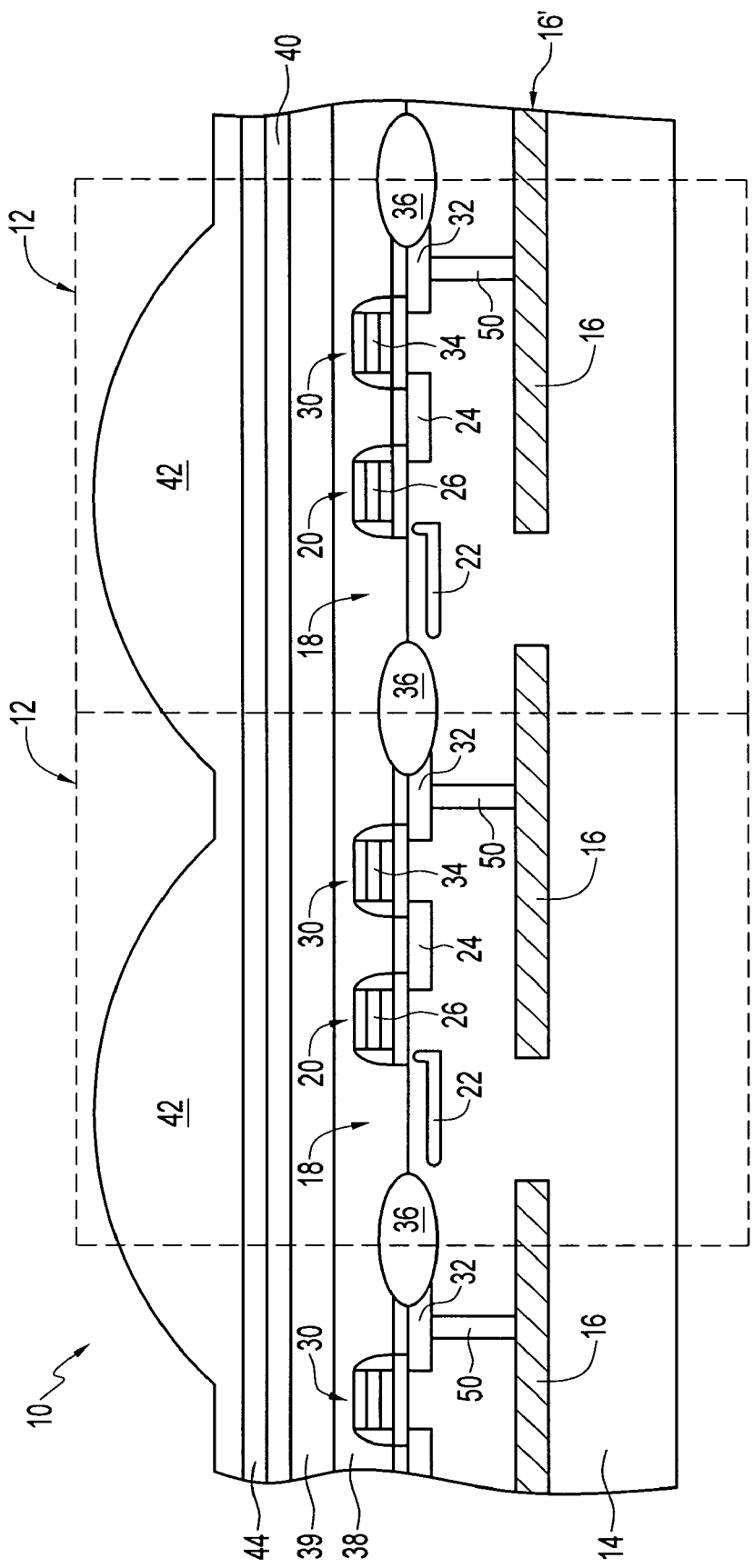
FIGS. 2A to 2C are cross-sectional views each of a portion of an imaging device including imager pixel cells constructed in accordance with alternative embodiments.
Figure 2B:
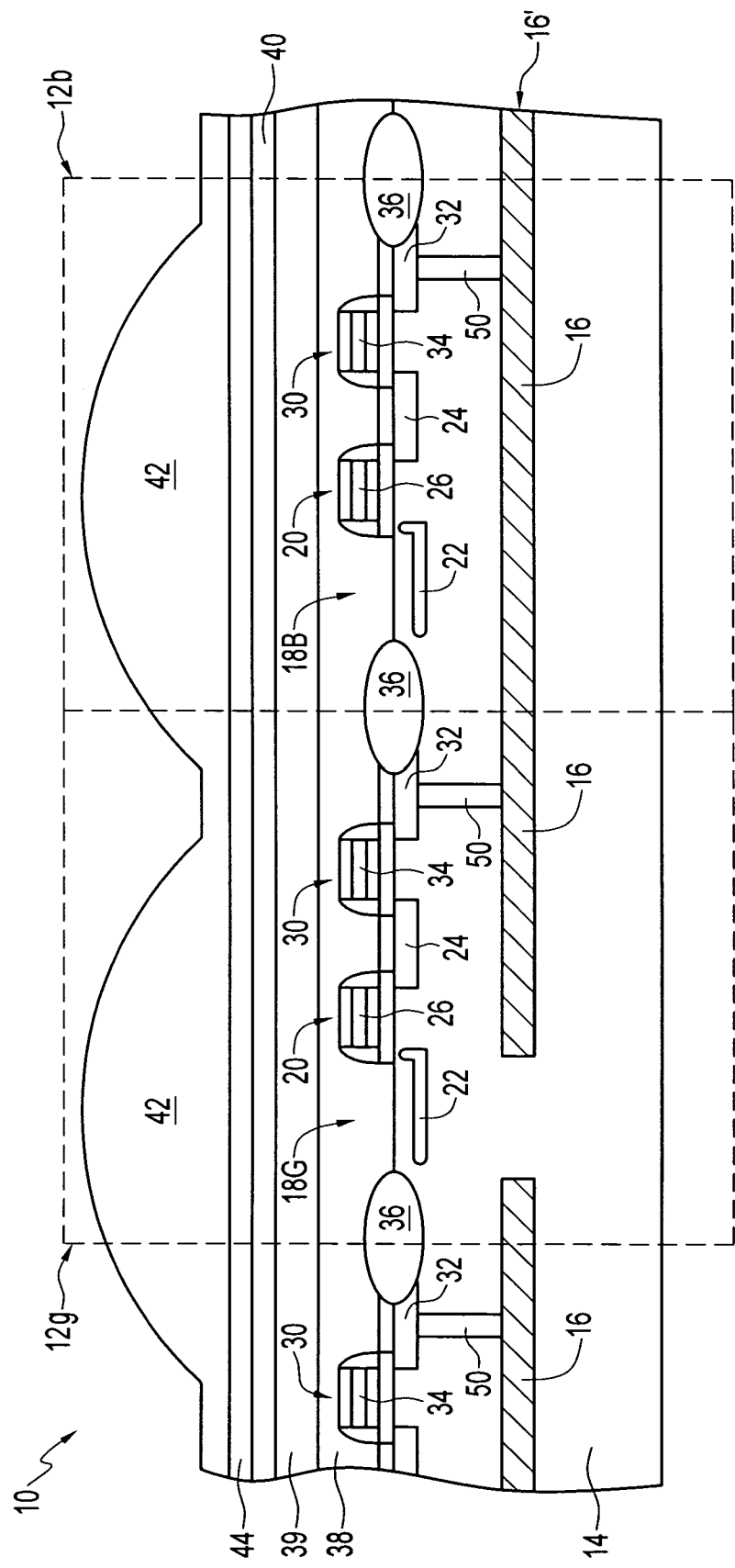

Reference is now made to FIGS. 2A and 2B showing alternative embodiments of an pixel array 10 formed with a protection region 16 having additional features. The readout source follower transistor 52 and row select transistor 54 circuitry, similar to that shown in FIG. 1, is omitted for simplicity. FIG. 2A shows two adjacent pixel cells 12, which are formed substantially the same as the pixel cell 12 shown in FIG. 1 and discussed above. For example, the protection region 16 in each of the pixel cells 12 is formed below the floating diffusion region 24 and other structures in the pixel cell 12, but not below the photosensor 18. The pixel array 10 so constructed can be used to detect visible light or infrared light.

As is also shown in FIG. 2A, the protection region 16 extends laterally and continuously below the transfer gate 26 and the entire reset transistor 30. Additionally, each protection region 16 extends laterally and below at least a portion of the pixel isolation regions 36 to provide a better charge collection in the pixel cell 12, thus improving isolation between pixel cells 12. In one embodiment, each protection region 16 discontinues below the photosensor 18 but extends continuously throughout the remaining portions of the pixel cell 12.

The various protection regions 16 in the pixel array 10 collectively form a protection layer 16' having a grid pattern. The protection layer 16' discontinues below one or more photosensors 18 of the array 10. The grid pattern of the protection layer 16' can vary depending on the type of light that the photosensors 18 are designed to capture. For example, as shown in FIG. 2A, the grid pattern is such that the protection layer 16' is discontinuous below all photosensors 18 in the pixel array 10. In another embodiment, the protection layer 16' can extend laterally beyond the pixel array 10 and also be provided as a continuous layer below peripheral circuitry of an imaging device 500 (see FIG. 5), outside pixel array 10.

FIG. 2B shows a further embodiment of a pixel array 10 which is formed with different types of pixel cells illustrated as 12g and 12b. The first type of pixel cell 12g is similarly formed as the pixel cell 12 shown in FIGS. 1 and 2A and discussed above. In the second type of pixel cell 12b, the protection region 16 is present below the photosensor 18B or otherwise formed continuously throughout the entire pixel cell 12b. In such a pixel array 10, the protection layer 16' discontinues below photosensor 18G in the first type pixel cell 12g, but extends below the photosensor 18B in the second type pixel cell 12b. For example, the protection layer 16' is not provided in the first type pixel cell 12g below the photosensor 18G, where photon conversion occurs deeper in the substrate 14, but is provided in the second type pixel cell 12b below the photosensor 18B, where photon conversion occurs near a surface of the substrate 14 or at a lesser depth in the substrate 14.

In one embodiment, the protection region 16 can be formed below one or more photosensors (e.g., photosensor 18B) for absorbing light component having a wavelength of 450 nm or less (e.g., blue light). As is shown in FIG. 2B, a pixel array 10 can include a row of alternating green and blue pixel cells 12g and 12b containing respectively green and blue photosensors 18G and 18B as may be present in a Bayer pattern array. It should be appreciated that FIG. 2B depicts only one row of green and blue pixel cells 12g and 12b, and that adjacent rows of alternating green and red cells (not shown but similar to the green pixel cell 12g) will also be present in the pixel array 10. The green pixel cell 12g is formed substantially the same as the pixel cell 12 discussed above. In each blue pixel cell 12b, the protection region 16 also extends below the blue photosensor 18B, or other portions of the pixel cell 12b. In the example shown, the protection region 16 extends continuously throughout the entire pixel cell 12b. The protection layer 16' in the pixel array 10 thus extends below one or more blue photosensors 18B, but discontinues below the green and red photosensors. As blue light has a shorter wavelength and will not reach as deep in the substrate 14 as does the green or red light, the protection region 16 formed under the blue photosensor 18B will not significantly affect the photon conversion and electron retention in connection with blue light.

Figure 2C:
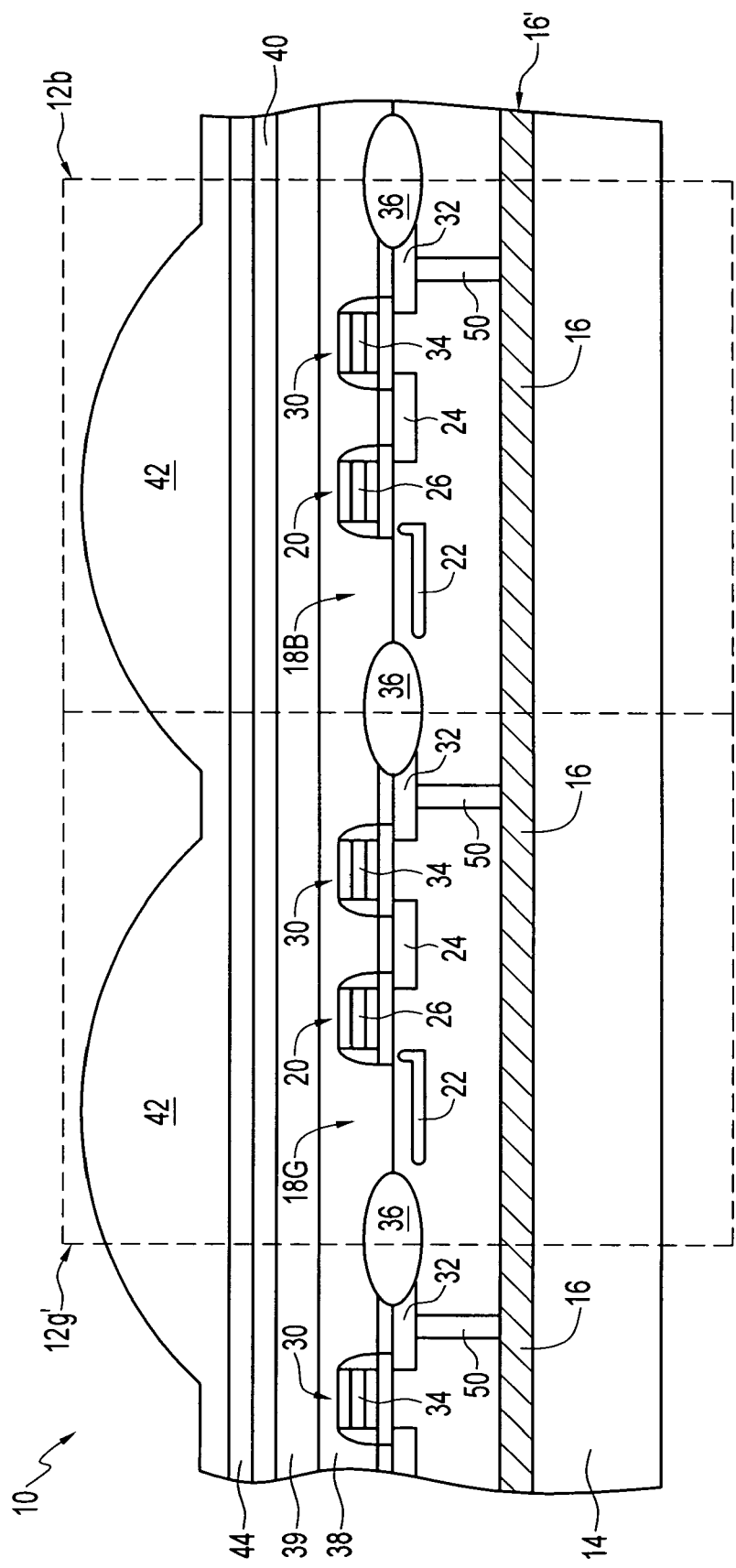

In another embodiment as shown in FIG. 2C, the protection region 16 can be formed below one or more photosensors (e.g., photosensors 18G, 18B) for absorbing light component having a wavelength of 620 nm or less (e.g., green and blue light). The pixel array 10 shown in FIG. 2C is similar to that shown in FIG. 2B, except for the construction of the green pixel cell 12g'. In this embodiment, the green pixel cell 12g' can be formed similarly as the blue pixel cell 12b shown in FIG. 2B and comprises a protection region 16 located below the green photosensor 18G. In such a pixel array 10, the protection layer 16' extends below both green and blue photosensors 18G and 18B and discontinues below only red photosensor (not shown).

Figure 3:
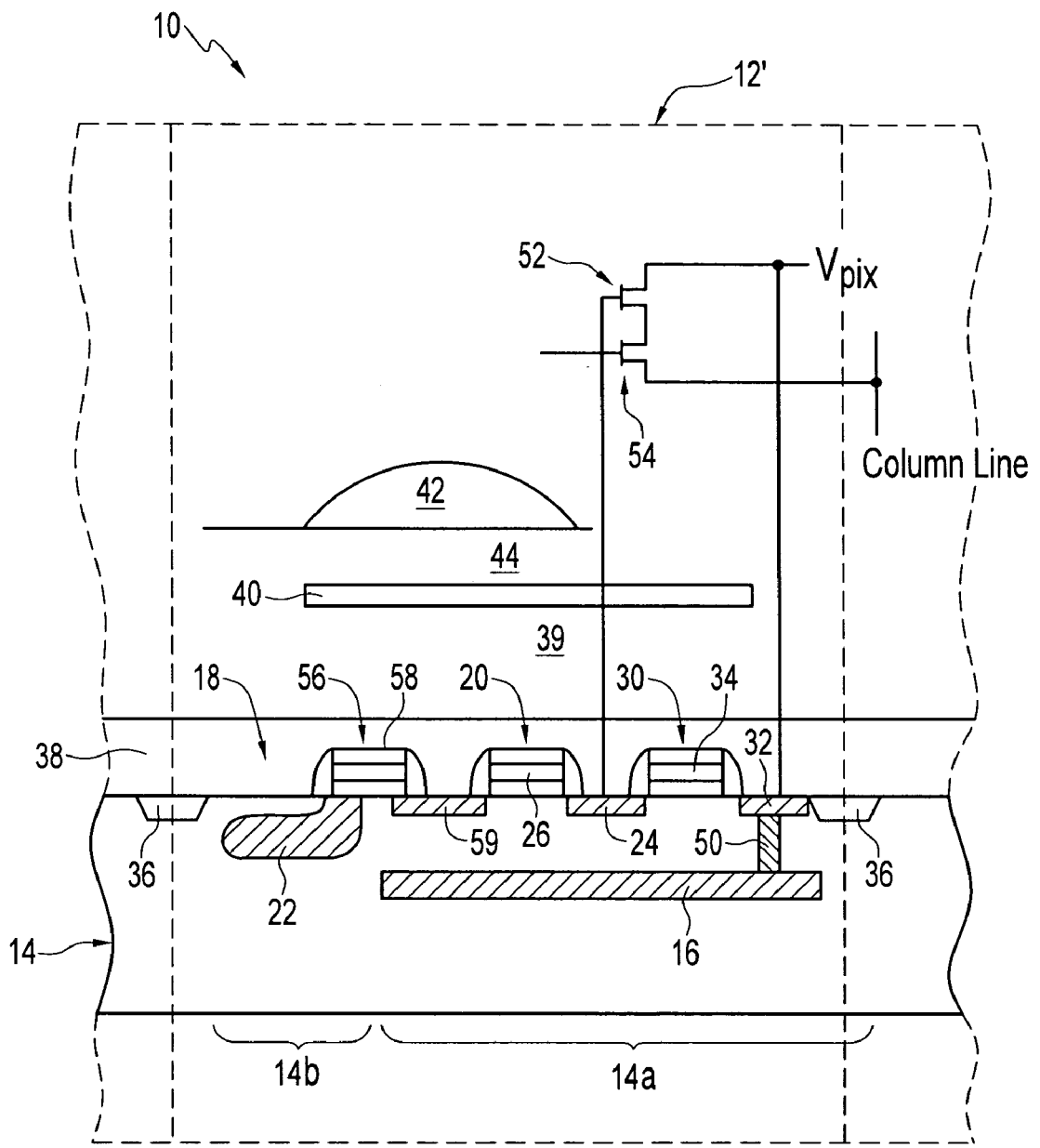
FIG. 3 is a representative diagram of a portion of an imaging device including an imager pixel cell constructed in accordance with a further embodiment.

FIG. 3 shows a further embodiment of a pixel array 10 in which a storage gate SG 56 is employed as part of a pixel cell 12'. The storage gate 56 includes a gate shutter 58 and a storage area 59. A global shutter control signal GS operates the storage gate 56 to transfer charges converted by the photosensor 18 to the storage area 59. The charges are kept in the storage area 59 until the transfer control signal TX operates to transfer such charges to the floating diffusion region 24.

In the embodiment shown in FIG. 3, the protection region 16 can be formed below at least a portion of or the entirety of the storage gate 56, in addition to the floating diffusion region 24 and other regions of the pixel cell 12'. For example, the protection region 16 can be provided under a portion of the gate shutter 58. Additionally or alternatively, the protection region 16 can be formed under a portion of or the entirety of the storage area 59. Similar to the various embodiments described hereinabove, the protection region 16 is not present below the photosensor 18.

The pixel array 10 described above, as well as an imaging device 500 (see FIG. 5) containing such a pixel array 10, can be manufactured by any of various known methods. FIGS. 4A-4F illustrate one embodiment of fabricating such a pixel array 10 and/or an imaging device 500. It should be noted that the details given in the following examples are not limiting. One skilled in the art will appreciate that the pixel array 10 and/or the imaging device 500 can be manufactured in many other ways.

Figure 4A:
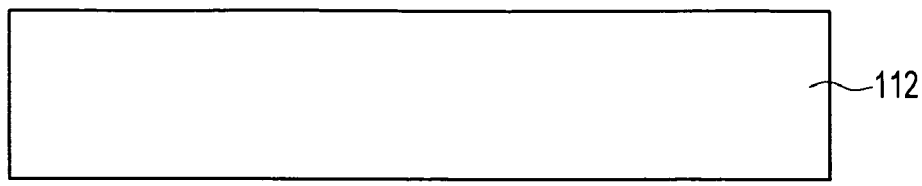
FIGS. 4A to 4F illustrate an example of a method of fabricating the imaging device as shown in FIGS. 1 to 3.

As shown in FIG. 4A, a semiconductor substrate 112 is provided. The illustrated substrate 112 is a $p^+$ substrate. It should be understood that the substrate 112 could also be formed of a $p^-$ material, in which case the process for forming the $p^-$ epitaxial layer 114 discussed below can be omitted.

Figure 4B:
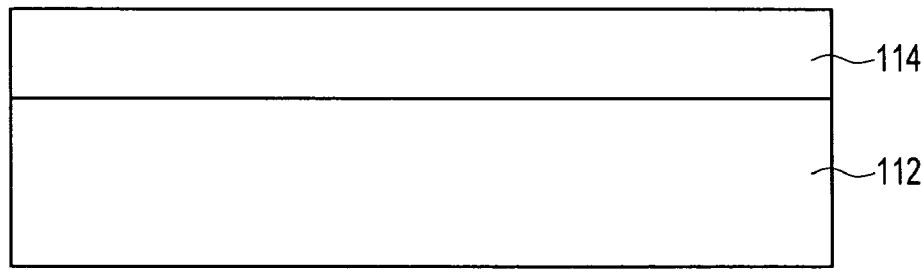

FIG. 4B shows the device according to FIG. 4A at a further stage of processing. When the substrate 112 is a $p^+$ material, a $p^-$ epitaxial layer 114 is grown over the substrate 112. The $p^-$ epitaxial layer 114 can be formed from known materials, such as, for example, silicon tetrachloride or silane. In one example, the $p^-$ epitaxial layer 114 is formed from silane. The $p^-$ epitaxial layer 114 may be grown with any method for growing single-crystal silicon. The thickness of the $p^-$ epitaxial layer 114 can be about 0.05 µm, 0.5 µm, or more. In one embodiment, the $p^-$ epitaxial layer 114 can have a thickness in the range of about 2 µm to about 4 µm.

Figure 4C:
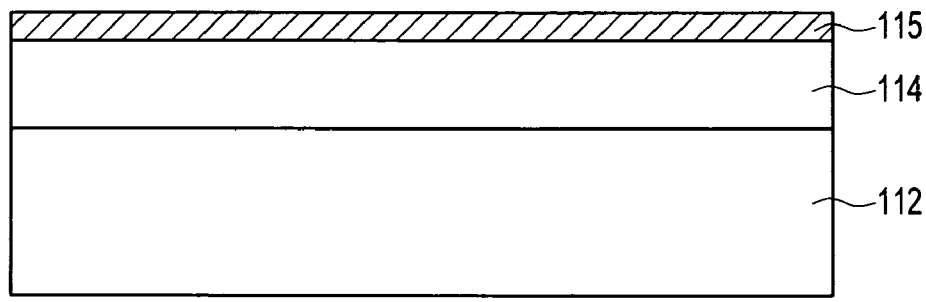

Reference is now made to FIG. 4C, which shows the device according to FIG. 4B at a further stage of processing. An oxide layer 115 is deposited over the $p^-$ epitaxial layer 114 by any method such as, for example, chemical vapor deposition or thermal oxidation. In one example, the oxide layer 115 is formed by thermal oxidation by exposing the surface of the $p^-$ epitaxial layer 114 in an oxygen atmosphere at an elevated temperature. The oxide layer 115 may be formed from any suitable material, such as nitride or ONO and prevent photoresist contamination of the wafer. The oxide layer 115 can have a thickness in the range of about 20 angstroms to about 500 angstroms.

Figure 4D:
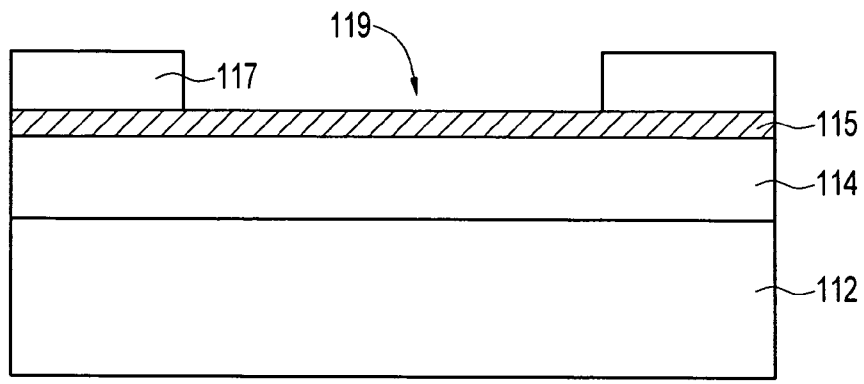

FIG. 4D shows the device according to FIG. 4C at a further stage of processing. A patterned photoresist layer 117 is formed over the oxide layer 115, such as by any of various conventional photoresist patterning and etching techniques. The pattern in the photoresist layer 117 can be determined based on the pattern of the protection layer 16' as discussed above. For example, the patterned photoresist layer 117 is formed over the predetermined areas 14b (FIG. 1) in the substrate 14 and corresponding to the location of the photosensors 18 (see, e.g., FIG. 1). Accordingly, the patterned photoresist layer 117 can protect the predetermined areas 14b and prevent the dopant from penetrating into such predetermined areas 14b during the ion implantation process for forming the protection regions 16 as described below. The selected removed portions 119 are to be formed over the selected areas 14a (FIG. 1) in the substrate 14 and correspond to the protection regions 16. In an alternative embodiment (not shown), with proper cleaning techniques, the patterned photoresist layer 117 could be applied directly to the p⁻ epitaxial layer 114, without using the oxide layer 115.

Additionally, depending on alignment tolerances, it may be desirable to pattern and etch a notch or mark (not shown) in the front side and/or the backside of the substrate 112 at the time of the photoresist patterning and etching and/or prior to the ion implantation. Such notch or mark can be used to facilitate the alignment of the doped regions 16 in the pixel cells 12 of the pixel array 10 and/or the imaging device 500 for later processing and alignment. For example, the doped regions 16 are to be positioned so that they will be located below the storage regions 28 and not below selected or all photosensors 18 in the pixel array 10, such as shown in FIGS. 2A and 2B.

Figure 4E:
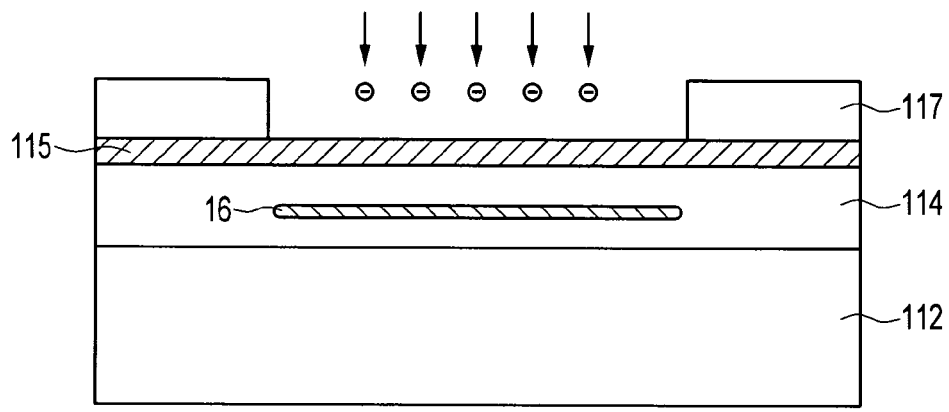

Reference is now made to FIG. 4E, which shows the device according to FIG. 4D at a further stage of processing. A protection region 16, such as an n-type well or tub, is formed in the p⁻ epitaxial layer 114, such as e.g., by implanting a dopant into the p⁻ epitaxial layer 114. The doped region 16 may be doped with any suitable dopant materials containing, for example, one or more of phosphorous or arsenic. In one embodiment, the dopant is arsenic. Various dopant concentrations, such as n⁺, n or n⁻ concentration, can be used to produce the protection region 16. For example, an n⁺ doped region 16 can have a dopant concentration in the range of about $1\times10^{10}$ ions/cm² to about $1\times10^{18}$ ions/cm², or from about $1\times10^{13}$ ions/cm² to about $1\times10^{15}$ ions/cm². The n⁺ doped region 16 can be doped by ion implantation at a power of about 15 KeV to about 50 MeV. It should be understood that the dopant concentration and power will vary depending upon a variety of physical parameters such as, for example, the material being implanted, the processing stage of the semiconductor substrate, the amount of material to be removed and other factors.

Figure 4F:
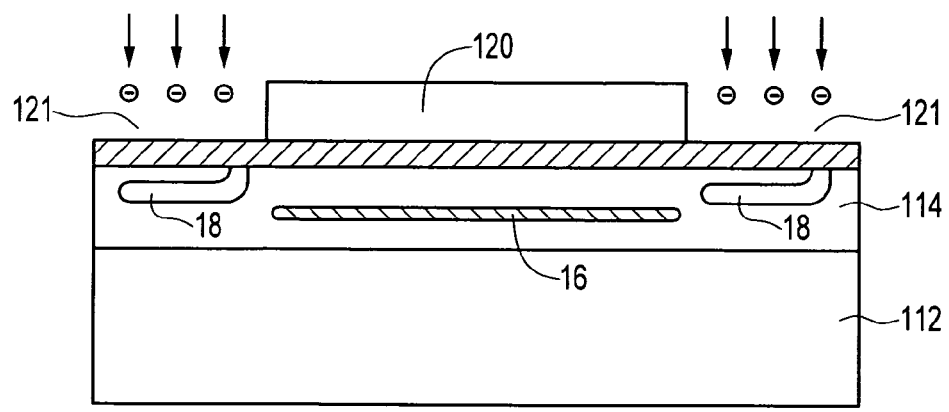

FIG. 4F shows the device according to FIG. 4E at a further stage of processing. The photoresist layer 117 is stripped off by any known method. A second patterned photoresist layer 120 is formed over the oxide layer 115, such as by any of various conventional photoresist patterning and etching techniques. The pattern in the photoresist layer 120 can be determined based on the pattern of the photosensors 18. For example, the patterned photoresist layer 120 can be formed over the doped region 16, while the selected removed portions 121 correspond to the location and configuration of the photosensors 18. The photosensors 18 can be formed by an ion implantation process that is known in the art. The second photoresist layer 120 is stripped off by any of various known methods after the photosensors 18 are formed in the p⁻ epitaxial layer 114.

Figure 5:
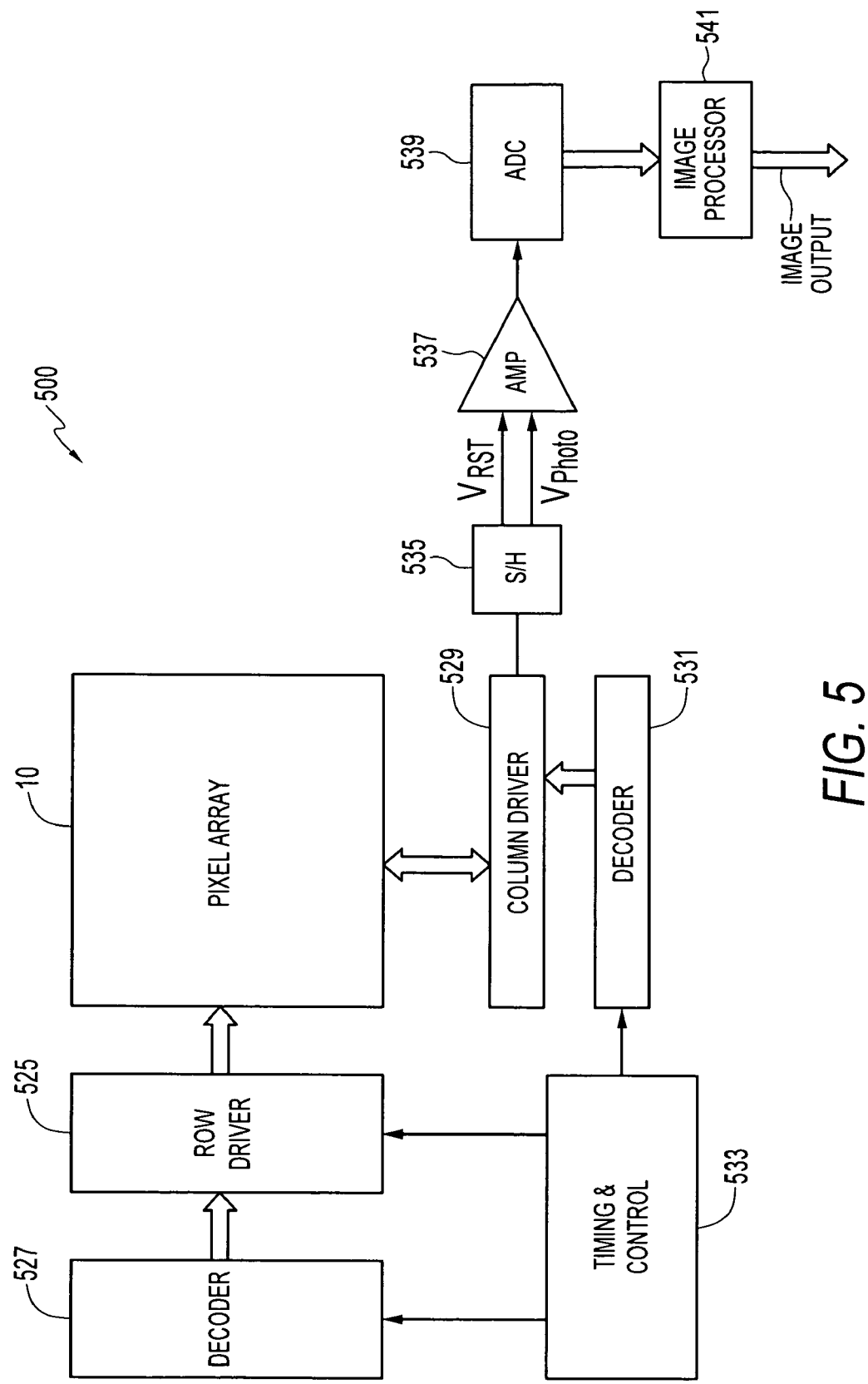
FIG. 5 is a block diagram of an imaging device constructed in accordance with one of the embodiments.

As one skilled in the art will appreciate, standard imager manufacture processing can be employed to form various other components of the pixel array 10, such as those illustrated in FIGS. 1-3, and/or the imaging device 500 (see FIG. 5). For example, another photoresist patterning and etching process can be used to form the implant 50 for connecting the protection region 16 to a biasing voltage source. Additional photoresist masking and implantation steps can be carried out to form various surface components, such as source/drain regions 22 and 24, gate stacks 26 and 34, and doped region 32 of the pixel transistors. In one embodiment (not shown), the transfer gate 26 and/or the reset gate 34 can be formed by any of various know methods either before or after ion implanting the photosensors 18. Various CMOS imaging circuits, processing steps thereof, and detailed descriptions of the functions of various CMOS elements of an imaging circuit are described, for example, in the aforementioned U.S. patents assigned to Micron Technology, Inc.

While the processes have been described with reference to a CMOS imager device, it should be understood that the process may be also used with pixel cells of other types of solid state imagers as well.

FIG. 5 is a block diagram of an imaging device 500 formed according to various embodiments described above. The imaging device 500 can comprise a pixel array 10 formed with pixel cells arranged in a predetermined number of columns and rows. The pixel array 10 may have pixels constructed in accordance with any of the embodiments described above. The incident radiation captured by the pixel array 10 can be converted to electrical signals, such as analog signals, corresponding to the light captured by the pixel array 10.

The electrical signals obtained and generated by the pixel cells 12 (see, e.g., FIG. 1) in the pixel array 10 can be read out row by row to provide image data. For example, pixel cells in a row of the pixel array 10 are all selected for read-out at the same time by a row select line, and each pixel cell in a selected column of the row provides a signal representative of received light to a column output line. That is, each column also has a select line, and the pixel cells of each column are selectively read out onto output lines in response to the column select lines. The row select lines in the pixel array 10 are selectively activated by a row driver 525 in response to a row address decoder 527. The column select lines are selectively activated by a column driver 529 in response to a column address decoder 531.

The imaging device 500 can also comprise a timing and controlling circuit 533, which generates one or more read-out control signals to control the operation of the various components in the imaging device 500. For example, the timing and controlling circuit 533 can control the address decoders 527, 531 in any of various conventional ways to select the appropriate row and column lines for pixel signal read-out.

The electrical signals output from the column output lines typically include a pixel reset signal ($V_{RST}$) and a pixel image signal ($V_{Photo}$) for each pixel cell 12. The pixel reset signal ($V_{RST}$) is taken from the floating diffusion region 24 when it is reset by a reset signal RST applied to a corresponding reset transistor 30 (see, e.g., FIG. 1). The pixel image signal ($V_{Photo}$) is taken from the floating diffusion region 24 when photo generated charge is transferred to the floating diffusion region 24 (see, e.g., FIG. 1). Both the $V_{RST}$ and $V_{Photo}$ signals can be read into a sample and hold circuit (S/H) 535. In one example, a differential signal ($V_{RST}$–$V_{Photo}$) can be produced by differential amplifier (AMP) 537 for each pixel cell. Each pixel cell's differential signal ($V_{RST}$–$V_{Photo}$) can be digitized by an analog-to-digital converter (ADC) 539, which supplies digitized pixel data as the image data to be output to the image processor 541. One skilled in the art would appreciate that the imaging device 500 and its various components can be in various other forms and/or operate in various other ways. In addition, the imaging device 500 illustrated, is a CMOS imager, but other types of imager core, may be used.

Figure 6:
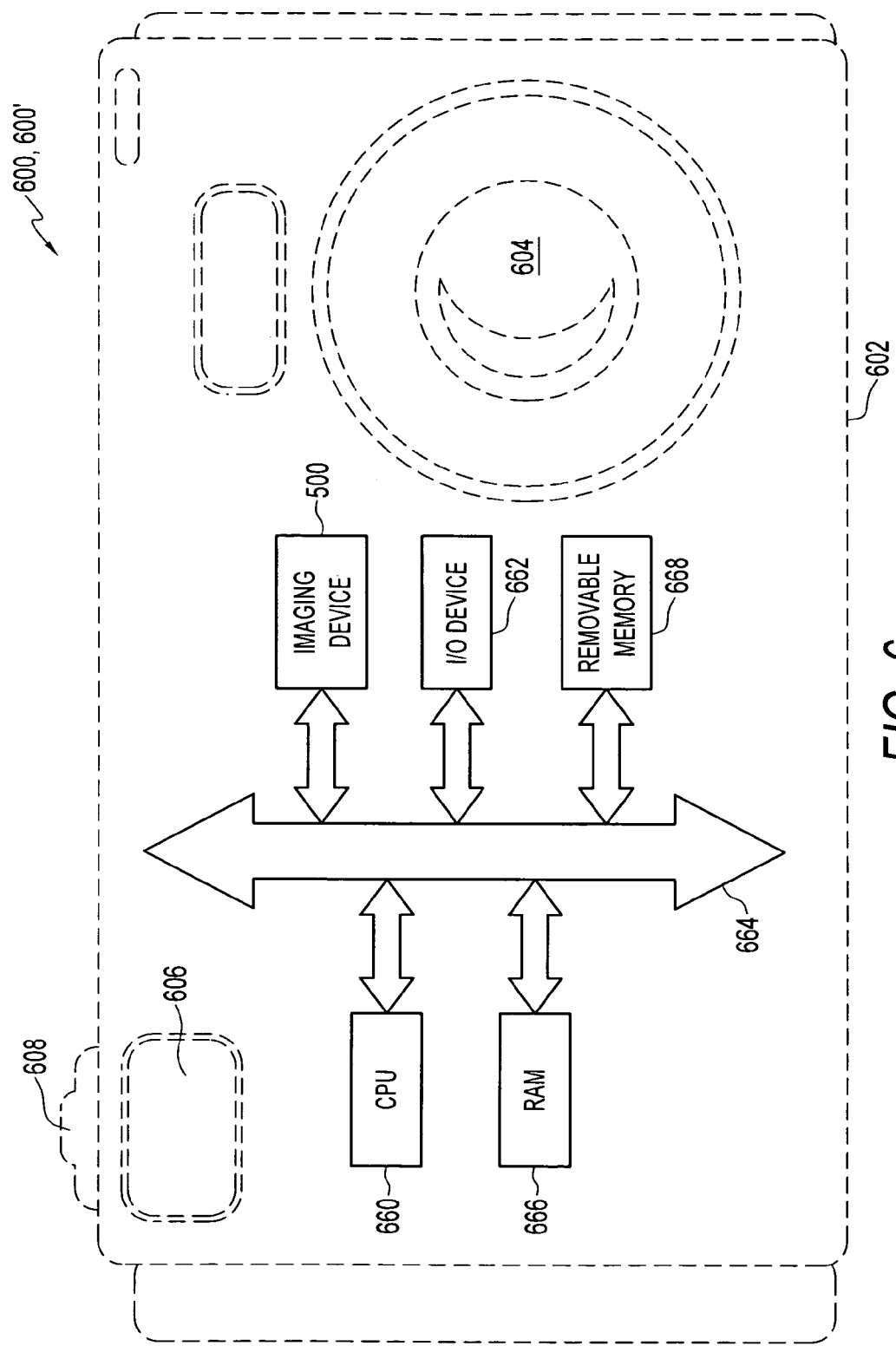
FIG. 6 is an illustration of an imaging system comprising the imaging device formed according to one of the embodiments.

FIG. 6 illustrates a processing system 600 including an imaging device 500, such as discussed above. The imaging device 500 may be combined with a processor, such as a CPU, digital signal processor, or microprocessor, with or without memory storage on a single integrated circuit or on a different chip than the processor. In the example as shown in FIG. 6, the processing system 600 is employed in a digital camera 602 and can generally comprise a central processing unit (CPU) 660, such as a microprocessor, that communicates with an input/output (I/O) device 662 over a bus 664. The processing system 600 can also comprise random access memory (RAM) 666, and can include removable memory 668, such as flash memory, which can communicate with CPU 660 over the bus 664.

The processing system 600 can be any of various systems having digital circuits that could include the imaging device 500. Without being limiting, such a system could include a computer system, a digital camera as illustrated in FIG. 6, a scanner, a machine vision, a vehicle navigation, a video phone system (e.g., a camera mobile phone), a surveillance system, an auto focus system, a star tracker system, a motion detection system, and other systems supporting image acquisition. In the digital camera example shown in FIG. 6, the processing system 600 has a camera body portion 602, a camera lens 604, a view finder 606, and a shutter release button 608. When depressed, the shutter release button 608 operates the imaging device 500 so that light from an image reaches and is captured by the pixel array 10. One skilled in the art will appreciate that the imaging device 500, the processing system 600, the camera system 600' and other various components contained therein can be formed and/or operate in various other ways.

It is again noted that although the above embodiments are described with reference to a CMOS imaging device, they are not limited to CMOS imaging devices and can be used with other solid state imaging device technology (e.g., CCD technology) as well.

It will be appreciated that the various features described herein may be used singly or in any combination thereof. Therefore, the invention is not limited to the embodiments specifically described herein. While the foregoing description and drawings represent examples of embodiments of the invention, it will be understood that various additions, modifications, and substitutions may be made therein as defined in the accompanying claims. In particular, it will be clear to those skilled in the art that other specific forms, structures, arrangements, proportions, materials can be used without departing from the essential characteristics thereof The presently disclosed embodiments are therefore to be considered in all respects as illustrative and not restrictive.

What is claimed as new and desired to be protected by Letters Patent of the United States is:

1. A pixel cell comprising:
   a photosensor for generating charge in response to incident light;
   a storage region of a first conductivity type for receiving charge from the photosensor;
   a charge collecting protection region of the first conductivity type located below at least a portion of the storage region but not below the photosensor and spaced from the storage region by an intermediate region of a second conductivity type; and
   an isolation region formed over and in contact with the charge collecting protection region and below the intermediate region.

2. The pixel cell of claim 1, wherein the first conductivity type is an n-type conductivity and the second conductivity type is a p-type conductivity.

3. The pixel cell of claim 1, wherein the storage region comprises a floating diffusion region and the protection region is located below the entire floating diffusion region.

4. The pixel cell of claim 1, wherein the storage region comprises at least a portion of a storage gate which receives charges from the photosensor.

5. The pixel cell of claim 4, wherein the storage gate comprises a storage area and the protection region extends below the entire storage area.

6. The pixel cell of claim 1, wherein the storage region comprises:
   at least a portion of a storage gate which receives charges from the photosensor; and
   a floating diffusion region which receives charges from the storage gate.

7. The pixel cell of claim 1 further comprising a transfer gate for gating charges from the photosensor to the storage region, the protection region extending below at least a portion of the transfer gate.

8. The pixel cell of claim 1 further comprising a reset gate, the protection region extending below at least a portion of the reset gate.

9. The pixel cell of claim 1, wherein the protection region extends below at least a portion of the pixel isolation region.

10. The pixel cell of claim 1, wherein the protection region extends laterally below all portions of the pixel cell except for the photosensor.

11. The pixel cell of claim 1, wherein the protection region has a dopant concentration in the range of about $1 \times 10^{10}$ ions/cm$^2$ to about $1 \times 10^{18}$ ions/cm$^2$.

12. The pixel cell of claim 11, wherein the dopant concentration is in the range of about $1 \times 10^{13}$ ions/cm$^2$ to about $1 \times 10^{15}$ ions/cm$^2$.

13. The pixel cell of claim 1, wherein the protection region has a thickness in the range of about 0.05 µm to about 4 µm.

14. The pixel cell of claim 13, wherein the protection region has a thickness in the range of about 0.5 µm to about 2.5 µm.

15. The pixel cell of claim 1, wherein the protection region is formed in a substrate and spaced from a surface of the substrate from about 1 µm to about 4 µm.

16. The pixel cell of claim 15, wherein the protection region is spaced from the surface of the substrate from about 2 µm to about 2.5 µm.

17. The pixel cell of claim 1, wherein the protection region is coupled to a voltage source terminal for supplying a bias voltage to the protection region.

18. The pixel cell of claim 17 further comprising a doped region of the first conductivity type for connecting the protection region to a region of the first conductivity type which is coupled to the terminal.

19. The pixel cell of claim 1, wherein the isolation region is of the second conductivity type.

20. An imager pixel array comprising a plurality of pixel cells arranged in rows and columns, each pixel cell comprising:
   a substrate;
   a photosensor for generating charge in response to incident light, said photosensor in the substrate;
   a storage region for receiving charge from the photosensor;
   a charge collecting protection region located below and spaced from the storage region; and
   an isolation region formed over and in contact with the charge collecting protection region,
   wherein, in at least one first pixel cell, the charge collecting protection region is not located below the photosensor in the first pixel cell, and
   wherein the substrate separates the isolation region from the storage region.

21. The imager pixel array of claim 20, wherein the storage region in each pixel cell comprises a floating diffusion region.

22. The imager pixel array of claim 21, wherein the storage region further comprises at least a portion of a storage gate which receives charges from the photosensor.

23. The imager pixel array of claim 20, wherein the protection regions form a protection layer extending laterally below all portions of the pixel array except for the first photo sensor.

24. The imager pixel array of claim 20, wherein the photosensor, the storage region, and the protection region in each pixel cell are of the same conductivity type.

25. The imager pixel array of claim 20, wherein the protection region in each pixel cell is spaced from the storage region by an intermediate region of a different conductivity type.

26. The imager pixel array of claim 20, wherein each pixel cell further comprises a doped region of the first conductivity type for connecting the protection region to a region of the first conductivity type which is coupled to the terminal.

27. The imager pixel array of claim 20, wherein the isolation region and the protection region are of different conductivity types.

28. The imager pixel array of claim 20, wherein the photosensor in the first pixel cell is formed to absorb light having a wavelength of about 450 nm or more.

29. The imager pixel array of claim 28, wherein the photosensor in the first pixel cell is formed to absorb light having a wavelength of about 620 nm or more.

30. The imager pixel array of claim 20, wherein the protection regions form a protection layer extending laterally below all portions of the pixel array except for the photosensors in the first pixel cells.

31. The imager pixel array of claim 20 further comprising at least one second pixel cell, wherein the protection region in the second pixel cell is located under both the photosensor and the storage region in the second pixel cell.

32. The imager pixel array of claim 31, wherein the photosensor in the second pixel cell is formed to absorb light having a wavelength of about 450 nm.

33. A method of forming an imaging device, the method comprising the acts of:
forming a first photosensor in a substrate;
forming a first storage region receiving charge generated by the first photosensor;
forming a charge collecting protection region; and
forming an isolation region over and in contact with the charge collecting protection region,
wherein the charge collecting protection region is located below the first storage region but not located below the first photosensor, and
wherein the substrate separates the isolation region from the first storage region.

34. The method of claim 33, wherein the act of forming a charge collecting protection region comprises forming the protection region by doping.

35. The method of claim 33, wherein the act of forming a charge collecting protection region comprises forming the protection layer to have an n-type conductivity.

36. The method of claim 33, wherein the act of forming a first storage region comprises the act of forming a floating diffusion region located over the protection region.

37. The method of claim 33 further comprising the act of forming a storage gate, wherein at least a portion of the storage gate is located over the protection region.

38. The method of claim 35, wherein the act of forming a storage gate comprises the act of forming a storage area, so that the entire storage area is located over the protection region.

39. The method of claim 33, wherein the act of forming a protection region comprises forming the protection region below all portions of the imaging device except for the first photosensor.

40. The method of claim 33 further comprising the act of forming an implant over a portion of the protection region, wherein the implant and the protection region have different conductivity types.

41. The method of claim 33 wherein the isolation region and the protection region have different conductivity types.

42. The method of claim 33 further comprising the acts of forming a second photosensor and a second storage region receiving charge generated by the second photosensor;
wherein the act of forming a charge collecting protection region comprises the act of forming the protection region below both the second photosensor and the second storage region.

43. The method of claim 42, wherein the act of forming a charge collecting protection region comprises the act of forming the protection region below all portions of the imaging device except for the first photosensor.

* * * * *